United States Patent [19]
Matsutani et al.

[11] Patent Number: 4,769,819
[45] Date of Patent: Sep. 6, 1988

[54] TWO STAGE CODING METHOD

[75] Inventors: Kiyoshi Matsutani; Ken Ohnishi, both of Nagaokakyo, Japan

[73] Assignee: Mitsubishi Denki Kabushiki Kaisha, Tokyo, Japan

[21] Appl. No.: 905,313

[22] PCT Filed: Dec. 19, 1985

[86] PCT No.: PCT/JP85/00694
§ 371 Date: Aug. 20, 1986
§ 102(e) Date: Aug. 20, 1986

[87] PCT Pub. No.: WO86/03911
PCT Pub. Date: Jul. 3, 1986

[30] Foreign Application Priority Data
Dec. 26, 1984 [JP] Japan .................. 59-280163

[51] Int. Cl.⁴ ............................................. G06F 11/10
[52] U.S. Cl. ............................................ 371/38; 371/40
[58] Field of Search ..................... 371/38, 39, 40, 2

[56] References Cited
U.S. PATENT DOCUMENTS

| | | | |
|---|---|---|---|
| 4,336,612 | 6/1982 | Inoue et al. | 371/39 |
| 4,398,292 | 8/1983 | Doi et al. | 371/39 |
| 4,413,340 | 11/1983 | Odaka et al. | 371/39 |
| 4,646,170 | 2/1987 | Kobayashi et al. | 371/39 X |
| 4,646,301 | 2/1987 | Okamoto et al. | 371/37 |
| 4,683,572 | 7/1987 | Baggen et al. | 371/37 |

Primary Examiner—Charles E. Atkinson
Attorney, Agent, or Firm—Birch, Stewart, Kolasch & Birch

[57] ABSTRACT

Errors which arise in recording and reproducing data in a recording material are corrected with the use of an error correction code such as an RS (Reed-Solomon) code, and a two stage $C_2$ and $C_1$ coding method is conducted at an interval of repetition of a combination of $[k_2/n_2]$ and $[k_2/n_2]+1$ on digital data having a two dimensional arrangement of $k_1$ in the first direction and $k_2$ in the second direction, whereby burst error correction ability is enhanced by the enhancement of error correction capacity.

1 Claim, 4 Drawing Sheets

TWO STAGE CODING METHOD

TECHNICAL FIELD

The present invention relates to a two stage coding method having a high burst error correction ability and also a random error correction ability equivalent to that of the prior art when an error correction code such as a Reed Solomon code (hereinafter referred to as "RS code") is used in order to correct data errors which arise in reproducing data recorded in a recording material such as a magnetic disk.

BACKGROUND ART

Generally, in recording and reproducing data into and from a recording material such as a magnetic disk a data error may arise dependent on the state of the recording material. A data error may be a burst error caused by a signal drop out on a random error caused by a deterioration in SN ratio. In order to correct these errors a two stage coded error correction code is used. As an example, a two stage code using RS codes on a GF ($2^8$) where q=8 will be considered. A two stage encoder is shown in FIG. 3. In FIG. 3, reference numeral 1 designates an input terminal, reference numeral 2 designates a $C_2$ encoder, reference numeral 3 designates an interleaving circuit, reference numeral 4 designates a $C_1$ encoder, the reference numeral 5 designates an output terminal. First of all, $C_2$ encoding is performed on the original data, interleaving is executed thereto, and thereafter $C_1$ encoding is conducted, and the resulting code signal is output to the output terminal. A two stage decoder is shown in FIG. 4. In FIG. 4, reference numeral 6 designates an input terminal, reference numeral 7 designates a $C_1$ decoder, reference numeral 8 designates a deinterleaving circuit, reference numeral 9 designates a $C_2$ decoder, and reference numeral 10 designates an output terminal. In this decoder deinterleaving is executed after the $C_1$ decoding, and thereafter $C_2$ decoding is conducted. There is a prior art two stage coding method which, assuming that data obtained by arranging $k_1 \times 9$ digits in a first direction and $k_2$ digits ($k_1 < k_2$) in a second direction as shown in FIG. 5 is arranged into 8 data words in the first direction, consists of adding a first check code of $n_2 - k_1$ digits, and thereafter adding a second check code of $n_1 - n_2$ digits as shown in FIG. 2. ($n_2$, $k_1$) RS code is used as the $C_2$ code, and ($n_1$, $n_2$) RS code is used as the $C_1$ code.

A specific coding example will be described with reference to FIGS. 5 and 2. When it is established that $k_1 = 32$, $k_2 = 128$, $n_1 = 40$, $n_2 = 36$, and $h_1 = h_2 = \ldots = h_{35} = h = 3$, the data region comprising the data and the first check code becomes data of $n_2 \times k_2 = 4608$ digits as shown in FIG. 5, and when $a_1$ is set to 1, $a_2$ to $a_{36}$ become as follows:

$$a_2 = a_1 + n_2 \times h + 1 = 110$$

$$a_3 = a_2 + n_2 \times h + 1 = 219$$

$$\vdots$$

$$a_{32} = a_{31} + n_2 \times h + 1 = 3380$$

$$a_{36} = a_{35} + n_2 \times h + 1 = 3816$$

and $C_2$ encoding is conducted on the data corresponding to the $a_1$-th, $a_2$-th, $\ldots$, $a_{32}$-th data with the use of the following generation polynomial of $C_2$ code $$G_2(x) = \prod_{i=0}^{n_2 - K_1 - 1} (x - \alpha^i),$$

where $\alpha$ is a root of a primary polynomial (for example, such as $x^8 + x^4 + x^3 + x^2 + 1$ on GF ($2^8$)). The generated check codes are arranged at the positions corresponding to the $a_{33}$-th, $a_{34}$-th, $\ldots$, $a_{36}$-th data. Next, $a_1$ is set as follows:

$$a_1 = a_1 + n_2 = a_1 + 36,$$

and similarly check codes are added to the data successively. Herein, if the calculated result of $a_2$ to $a_{36}$ exceeds $n_2 \times k_2 = 4608$, a number obtained by subtracting 4608 therefrom is made the result. The encoding is repeated $k_2$ times thereby to conclude the $C_2$ encoding.

Next, $C_1$ encoding is conducted on the data of $n_2$ digits in each column arranged in the first direction as shown in FIG. 2 with the use of the following generation polynomial of $C_1$ code $$G_1(x) = \prod_{i=0}^{n_1 - n_2 - 1} (x - \alpha^i).$$

The generated check code is added to the end portion of the data and the encoding is repeated $k_2$ times. In the recording of the data onto the recording material data of $n_1 = 40$ digits arranged in the first direction is sent out $k_2$ times successively. In the reproduction of the same the sent out data are arranged in a column in the first direction by 40 digits successively.

In the prior art two stage coding method with such a construction, the $C_2$ code is concerned with burst error correction ability, and the $C_1$ and $C_2$ codes are concerned with random error correction ability. In the stage of conducting $C_2$ encoding the h must be made large in order to enhance the burst error correction ability, and h is set as follows:

$$h = [k_2/n_2] = [128/36] = 3$$

The $C_2$ codes are gathered at the right end portion of the data region in FIG. 5, and the $C_2$ and the $C_1$ code are arranged adjacent to each other in the first direction subsequent to the data of $k_1 = 32$ digits when the $C_1$ encoding is completed.

The prior art two stage coding method is constructed in such a manner, and the error correction ability by one code amounts to $n_2 - k_1$ digits when forfeiture correction is conducted by the $C_2$ decoding. Accordingly, the burst error correction ability becomes as follows for data of $n_2 \times k_2 = 4608$ digits comprising all the data and the $C_2$ code $$(n_2 - k_1) \times n_2 \times h = 432,$$

but h becomes as follows:

$$h = [k_2/n_2] = [128/36] = 3 < 128/36,$$

and $k_2/n_2$ does not equal an integer, thereby resulting in deterioration of error correction capability.

DISCLOSURE OF THE INVENTION

The present invention is directed to solve the problems pointed out above and an object is to provide a two stage coding method in which the above-described deterioration in a burst error correction ability is improved and a higher burst error correction ability than that of the prior art device is obtained.

According to the coding method of the present invention, assuming that data of $k_1 \times 8 \times k_2$ digits are arranged in a matrix of $k_1 \times 8$ digits in a first direction and $k_2$ digits(s) in a second direction and the data is divided into words of 8 digit(s) in the first direction, in conducting $C_2$ encoding by taking out $n_2$ data words from the data of $n_2$ words in the first direction and $k_2$ words in the second direction with no duplication of data in either of the first and second directions, a $C_2$ code of code length $n_2$ is produced by establishing $a_1$ at an arbitrary data number word, and establishing $h_1, h_2, \ldots, h_{n_2-1}$ such that they become a repetition of a combination satisfying the condition that $[k_2/n_2]$ and $[k_2/n_2]+1$ may be $$[k_2/n_2] \times l_1 + ([k_2/n_2]+1) \times l_2 \leq k_2$$

(herein, $l_1 + l_2 = n_2$ ($l_1, l_2$: integer) and $a_2$ to $a_{n2}$ exceeding $n_2 \times k_2$ are obtained by subtracting $n_2 \times k_2$ therefrom) for $a_2$ to $a_{n2}$ as in the following:

$$a_2 = a_1 + n_2 \times h1 + 1$$

$$a_3 = a_2 + n_2 \times h_2 + 1$$

.
.
.

$$a_{k1} = a_{k-1} + n_2 \times h_{k1-1} + 1$$

.
.
.

$$a_{n2} = a_{n-1} + n_2 \times h_{n2-1} + 1$$

when numbering is conducted successively in the first direction on the data of $n_2$ words in the first direction and $k_2$ words in the second direction, and this is repeated $k_2$ times in the second direction, and thereafter $C_1$ encoding of each $n_2 \times q$ digits in the first direction into a code length $n_1$ is conducted.

In the two stage coding method of the present invention, $C_2$ codes are constructed to be effective for error correction at the portion of $n_2 - k_1$ in the first direction and at the portion of $k_2$ in the second direction against the data obtained by arranging $k_1$ digits in the first direction and $k_2$ digits in the second direction, as shown in FIG. 1. Accoding to the present invention, the burst error correction ability against the data of $n_2 \times k_2 = 4608$ digits comprising all the data, and the $C_2$ codes becomes $$(n_2 - k_1) \times n_2 \times (h_A + h_B)/2 = 504,$$

and this exceeds 432 which is the burst error correction ability of the prior art device against the same number of data and the same number of check codes.

In this way, it is possible to conduct a two stage coding having a higher burst error correction ability than that of the prior art, and having a random error correction ability equivalent to that of the prior art due to the $C_1$ and $C_2$ codes.

BEST MODES OF EMBODYING THE INVENTION

Figure 1:
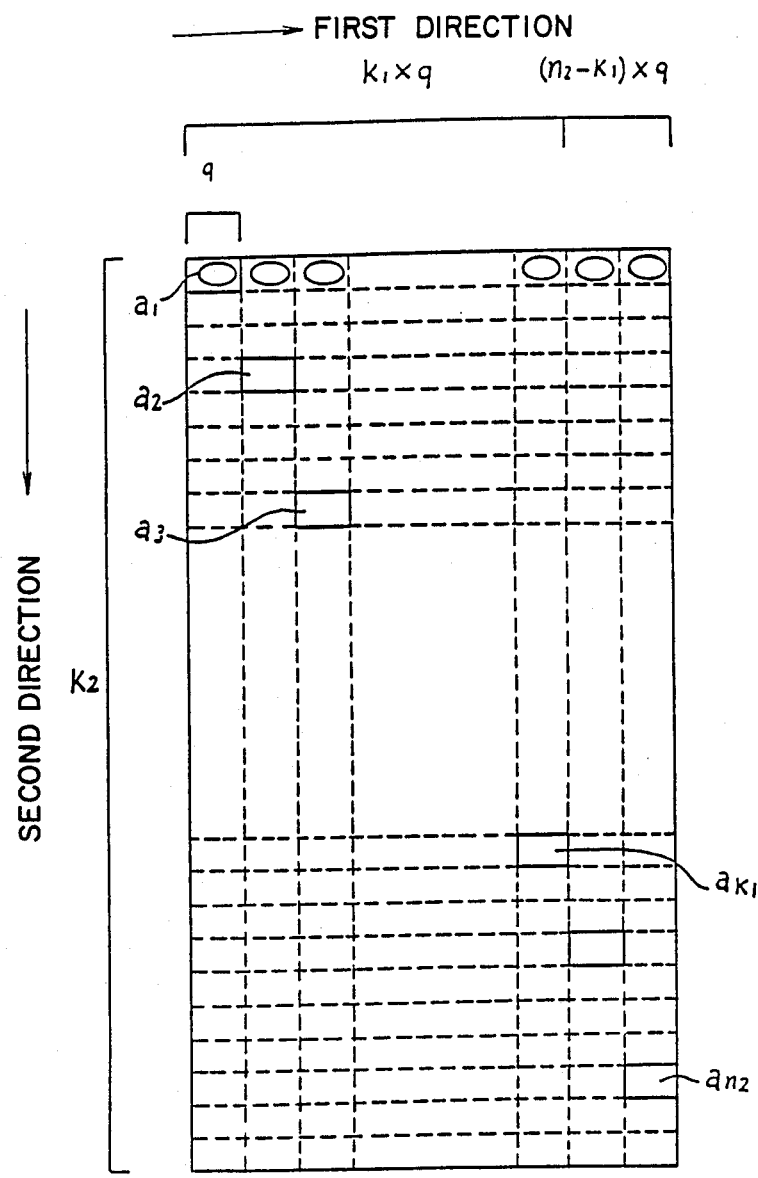
FIG. 1 is a diagram showing a data arrangement for conducting a $C_2$ encoding method as one embodiment of the present invention.
Figure 2:
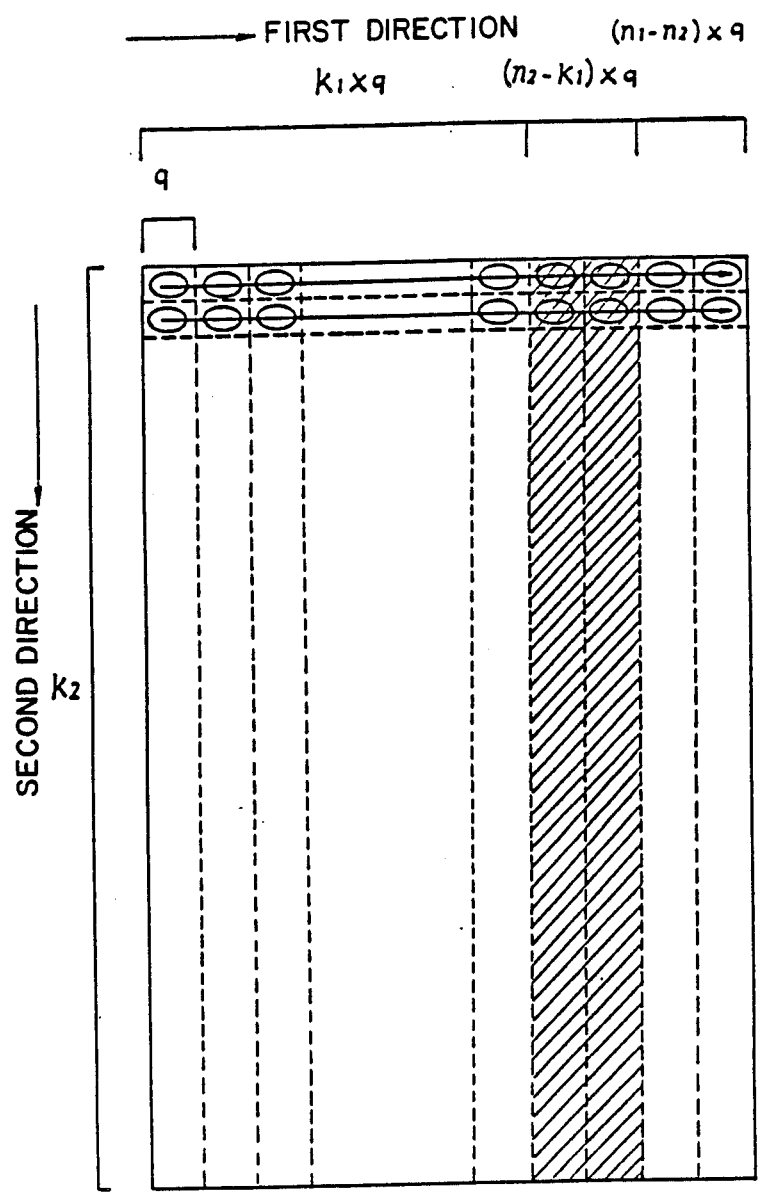
FIG. 2 is a diagram showing a data arrangement for conducting a prior art two stage coding method and a $C_1$ encoding method as an embodiment of the present invention.
Figure 3:
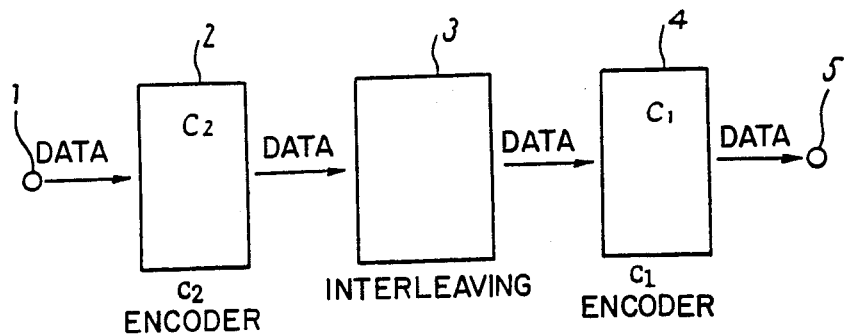
FIG. 3 is a block diagram showing a two stage encoding circuit.
Figure 4:
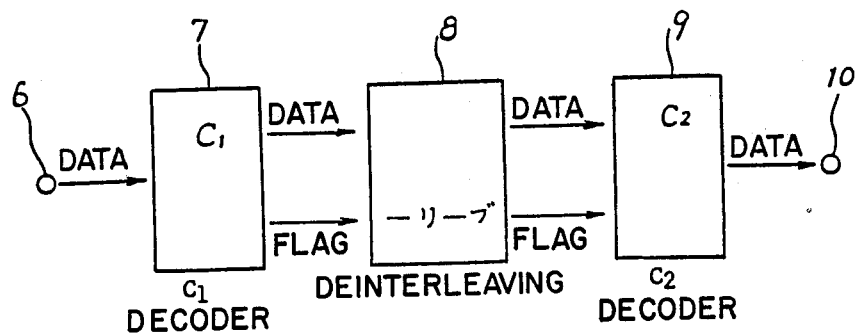
FIG. 4 is a block diagram showing a two stage decoding circuit.
Figure 5:
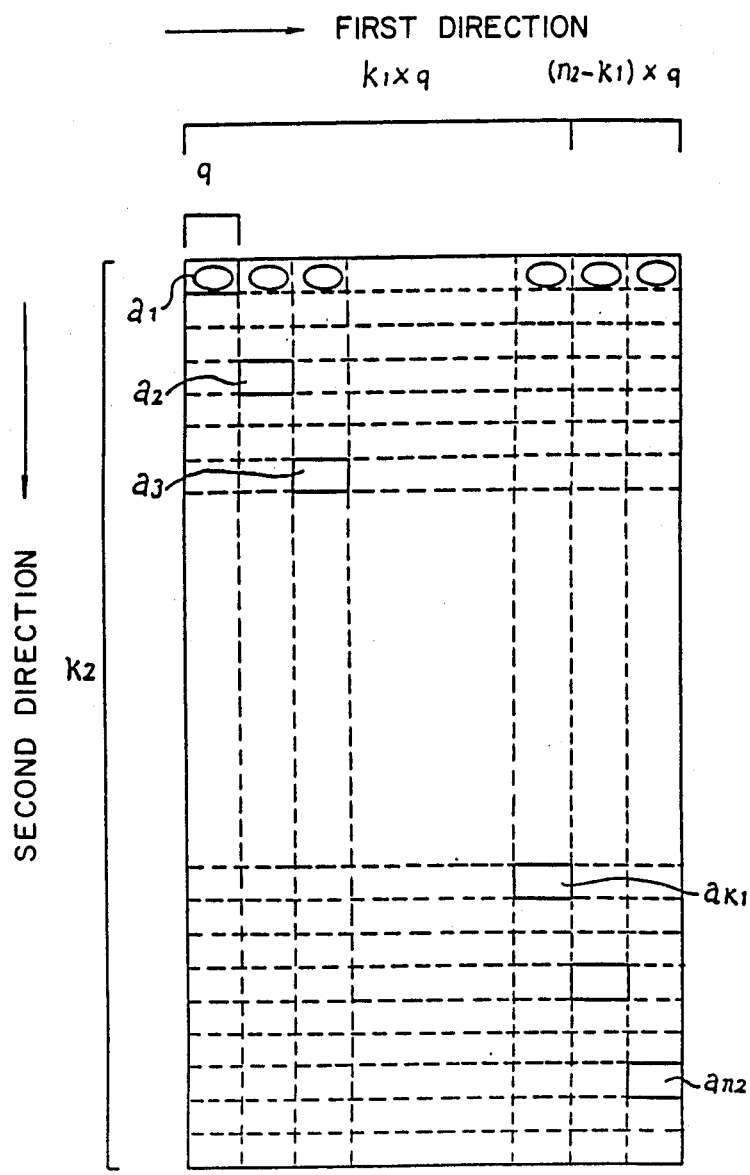
FIG. 5 is a diagram showing a data arrangement for conducting the $C_2$ encoding method of the prior art two stage coding method.

Embodiments of the present invention will be described with reference to the drawings. In FIGS. 1 and 2, the constants are established that $q=8$, $k_1=32$, $k_2=128$, $n_1=40$, $n_2=36$, and data are divided into words of 8 digits in the first direction. FIG. 1 shows a $C_2$ encoding method. Data of $k_1 \times k_2 = 4096$ data words are arranged sequentially in the first direction and in a matrix of $k_1=32$ words in the first direction and $k_2=128$ words in the second direction, and when $h_{2i-1}$ and $h_{2i}$ are set as follows $$h_{2i-1} = h_A = [k_2/n_2] = 3$$

$$h_{2i} = h_B = [k_2/n_2] + 1 = 4,$$

(i: integer, $1 \leq i \leq (n_2-1)/2$)
and $a_1$ is set 1, $a_2$ to $a_{36}$ become $$a_2 = a_1 + n_2 \times h_A + 1 = 110$$

$$a_3 = a_2 + n_2 \times h_B + 1 = 255$$

.
.

$$a_{32} = a_{31} + n_2 \times h_A + 1 = 3920$$

$$a_{36} = a_{35} + n_2 \times h_A + 1 = 4428$$

and, $C_2$ encoding is performed on the data corresponding to the $a_1$-th, $a_2$-th, $\ldots$, and $a_{32}$-th data with the use of the generation polynomial of the $C_2$ code $$G_2(x) = \prod_{i=0}^{n_2-k_1-1} (x - \alpha^i).$$

Herein, $\alpha$ is a root of a primary polynomial. The generated check codes are arranged at the positions corresponding to the $a_{33}$-th, $a_{34}$-th, ..., $a_{36}$-th data. Next, $a_1$ is set as follows $$a_1 = a_1 + n_2 = a_1 + 36$$

and similarly inspection codes are added to the data successively. $a_2$ to $a_{36}$ exceeding $n_2 \times k_2 = 4608$ are made by subtracting 4608 therefrom. When this encoding operation is repeated $k_2$ times the $C_2$ encoding is completed.

Next, $C_1$ encoding is performed on the data of $n_2$ words in each column arranged in the first direction as shown in FIG. 2 with the use of the generation polynomial of $C_1$ code $$G_1(x) = \prod_{i=0}^{n_1-n_2-1} (x - \alpha^i).$$

The generated check codes are added to the data, and the encoding is repeated $k_2$ times. The recording of the data on a recording material is conducted by sending out data of $n_1 = 40$ words arranged in the first direction successively $k_2$ times. The data format reproduction is conducted by arranging the sent out data by 40 words successively in a column in the first direction.

In the two stage coding method of the present invention, the $C_2$ code is concerned with burst error correction ability and both $C_1$ and $C_2$ codes are concerned with random error correction ability. In conducting the $C_2$ encoding, $C_2$ codes of $n_2 - k_1$ in the first direction and $k_2$ in the second direction can be used effectively for the error correction of the data arranged in a matrix of $k_1$ in the first direction and $k_2$ in the second direction.

In the above-illustrated embodiment a repetition pattern of $(h_A, h_B)$ is adopted for $h_1, h_2, \ldots, h_{n2-1}$, but other combinations using $h_A$ and $h_B$ such as $(h_B, h_A)$ or $(h_A, h_B, h_B)$ can be used if they comply with the following conditions $$h_A \times l_1 + h_B \times l_2 \leq k_2$$

$$l_1 + l_2 = n_2$$

Furthermore, an RS code on GF ($2^q$) is used as an error correction code, but another code such as a BCH code can be used as an error correction code. Furthermore, the number of data, the construction of information lengths in the first and second directions, and the $C_2$ and $C_1$ code lengths can be arbitrarily established. Furthermore, in the illustrated embodiment the region occupied by the check codes of the $C_2$ code and the $C_1$ code is shown in FIG. 2, but this occupied region can be arbitrarily established by establishing $a_1$ at an arbitrary number.

Furthermore, it is possible to add the additional information of $k_3 \times q$ digits in the second direction $k_2$ times precedent to the $C_1$ encoding, and thereafter to conduct $C_1$ encoding on GF ($2^q$) having the $(n_1 + k_3) \times q$ digits in the first direction, and to conduct a coding $k_2$ times repeatedly in the second direction.

APPLICABILITY TO THE INDUSTRY

The present invention is applicable not only to a magnetic disk apparatus but also to an optical recording and reproducing apparatus, and an optical magnetic recording and reproducing apparatus.

We claim:

1. A two stage coding system for encoding digital information arranged in a matrix of $k_1 \times q$ digits in a first direction, and $k_2$ digits in a second direction orthogonal to the first direction, wherein $K_1$, q, and $k_2$ are integers, $K_1 < k_2$; q = the number of digits per data word, and $K_1$, $K_2$ = the number of data words in said first and second directions respectively, comprising:

$C_2$ encoder means for encoding said digital information with a $C_2$ code on a Galois Field GF ($2^q$), including means for numbering data words in said matrix diagonally from an arbitrary data word $a_1$ and establishing $a_2$ to $a_{n2}$, wherein $n_2$ is the length of code $C_2$, such that $$a_2 = a_1 + n_2 \times h_1 + 1$$
$$a_3 = a_2 + n_2 \times h_2 + 1$$
$$\vdots$$
$$a_{k1} = a_{k1-1} + n_2 \times h_{k1-1} + 1$$
$$\vdots$$
$$a_{n2} = a_{n2-1} + n_2 \times h_{n2-1} + 1$$

wherein $h_1$ to $h_{n2-1}$ satisfy the following $$h_{2i-1} = [K_2/n_2]$$
$$h_{2i} = [k_2/n_2] + 1 \quad 1 \leq i \leq (n_2-1)/2$$

means for $C_2$ encoding said numbered data words, and means for adding the obtained $C_2$ code to an end of said matrix in said first direction; and $C_1$ encoder means for encoding said $C_2$ encoded matrix with a $C_1$ code having a length of $n_1$ on a GF ($2^q$) for each row of data words in said first direction, and adding the obtained $C_1$ code to an end of said matrix in said first direction.

* * * * *